United States Patent
Iso et al.

(10) Patent No.: US 10,177,217 B2
(45) Date of Patent: Jan. 8, 2019

(54) C-PLANE GAN SUBSTRATE

(71) Applicant: MITSUBISHI CHEMICAL CORPORATION, Tokyo (JP)

(72) Inventors: Kenji Iso, Tokyo (JP); Hiromitsu Kimura, Tokyo (JP); Yuya Saito, Tokyo (JP); Yuuki Enatsu, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 15/681,971

(22) Filed: Aug. 21, 2017

(65) Prior Publication Data

US 2017/0352721 A1  Dec. 7, 2017

Related U.S. Application Data

(63) Continuation of application No. PCT/JP2016/054550, filed on Feb. 17, 2016.

(30) Foreign Application Priority Data

Feb. 23, 2015 (JP) .................. 2015-032948

(51) Int. Cl.
*H01L 29/04* (2006.01)
*C30B 25/04* (2006.01)
(Continued)

(52) U.S. Cl.
CPC ............ *H01L 29/045* (2013.01); *C23C 16/34* (2013.01); *C30B 25/04* (2013.01); *C30B 29/406* (2013.01);
(Continued)

(58) Field of Classification Search
CPC ............... H01L 29/045; H01L 29/0603; H01L 21/02647; H01L 21/0265; H01L 21/02389
(Continued)

(56) References Cited

U.S. PATENT DOCUMENTS 8,928,004 B2 * 1/2015 Choe .................. C30B 25/04
257/76
2002/0066403 A1 6/2002 Sunakawa et al.
(Continued)

FOREIGN PATENT DOCUMENTS

JP 2002-373864 A 12/2002
JP 2003-165799 A 6/2003
(Continued)

OTHER PUBLICATIONS

International Preliminary Report on Patentability dated Sep. 8, 2017 for the corresponding PCT Application No. PCT/JP2016/054550.
(Continued)

*Primary Examiner* — Hsien Ming Lee
(74) *Attorney, Agent, or Firm* — Leason Ellis LLP

(57) ABSTRACT

A C-plane GaN substrate only mildly restricts the shape and dimension of a nitride semiconductor device formed on the substrate. The variation of an off-angle on the main surface of the substrate is suppressed. In the C-plane GaN substrate: the substrate comprises a plurality of facet growth areas each having a closed ring outline-shape on the main surface; the number density of the facet growth area accompanied by a core among the plurality of facet growth areas is less than 5 $cm^{-2}$ on the main surface; and, when any circular area of 4 cm diameter is selected from an area which is on the main surface and is distant by 5 mm or more from the outer peripheral edge of the substrate, the variation widths of an a-axis direction component and an m-axis direction component of an off-angle within the circular area is each 0.25 degrees or less.

22 Claims, 9 Drawing Sheets

(51) Int. Cl.
*C23C 16/34* (2006.01)
*H01L 21/02* (2006.01)
*H01L 29/06* (2006.01)
*C30B 29/40* (2006.01)

(52) U.S. Cl.
CPC .. *H01L 21/02389* (2013.01); *H01L 21/02516* (2013.01); *H01L 21/02647* (2013.01); *H01L 29/0603* (2013.01)

(58) Field of Classification Search
USPC ............... 438/416, 481, 503, 590, 604, 607
See application file for complete search history.

(56) References Cited

U.S. PATENT DOCUMENTS

| | | |
|---|---|---|
| 2002/0189532 A1 | 12/2002 | Motoki et al. |
| 2003/0080345 A1 | 5/2003 | Motoki et al. |
| 2006/0272572 A1 | 12/2006 | Uematsu et al. |
| 2009/0108297 A1 | 4/2009 | Sato et al. |
| 2015/0311068 A1 | 10/2015 | Tsukada et al. |

FOREIGN PATENT DOCUMENTS

| | | |
|---|---|---|
| JP | 2005-094029 A | 4/2005 |
| JP | 2006-066496 A | 3/2006 |
| JP | 2007-254258 A | 10/2007 |
| JP | 2009-120465 A | 6/2009 |
| JP | 2009-141085 A | 6/2009 |
| WO | WO-2014/097931 A1 | 6/2014 |

OTHER PUBLICATIONS

International Search Report dated May 10, 2016 for the corresponding PCT Application No. PCT/JP2016/054550.

\* cited by examiner

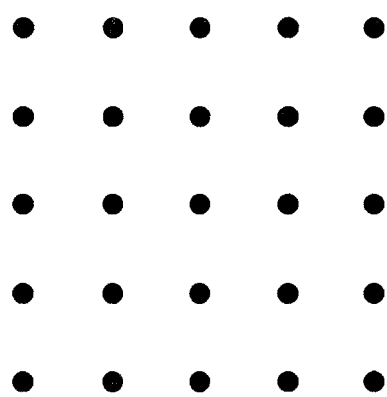 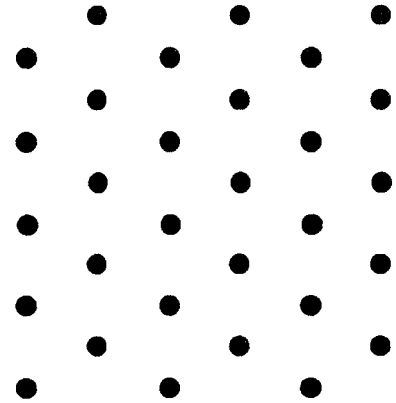
FIG.3A    FIG.3B
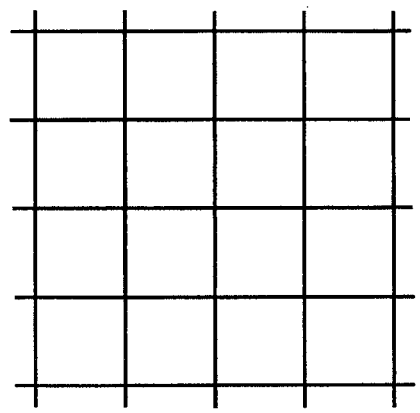 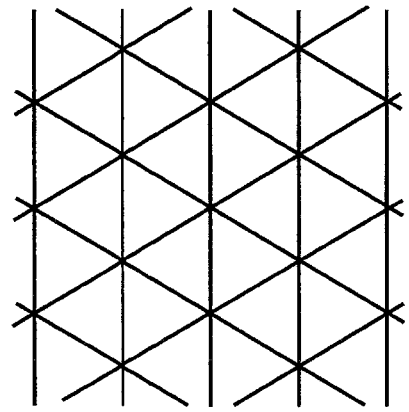
FIG.4A    FIG.4B

C-PLANE GAN SUBSTRATE

CROSS-REFERENCE TO RELATED APPLICATION

This is a continuation of International Application PCT/JP2016/054550, filed on Feb. 17, 2016, and designated the U.S., and claims priority from Japanese Patent Application 2015-032948 which was filed on Feb. 23, 2015, the entire contents of which are incorporated herein by reference.

TECHNICAL FIELD

The present invention mainly relates to a C-plane GaN substrate.

BACKGROUND ART

GaN (gallium nitride) is one of Group III-V compound semiconductors and has a wurtzite-type crystal structure belonging to a hexagonal system.

In recent years, a GaN substrate being a single crystal substrate configured by only a GaN crystal has attracted attention as a substrate for a nitride semiconductor device.

A nitride semiconductor is also called a "III nitride-based compound semiconductor", "nitride-based Group III-V compound semiconductor", "GaN-based semiconductor" or the like, and includes, besides GaN, compound(s) where gallium in GaN is partially or fully substituted with other Group 13 elements (B, Al, In, or the like) in the periodic table.

One particularly useful GaN substrate is a C-plane GaN substrate having a main surface parallel to or substantially parallel to the C-plane.

The C-plane GaN substrate has a gallium polar surface being a main surface on the [0001] side and a nitrogen polar surface being a main surface on the [000-1] side. The gallium polar surface is currently mainly used for formation of nitride semiconductor devices.

A GaN crystal grown by an HVPE (Hydride Vapor Phase Epitaxy) method is used for a commercially produced C-plane GaN substrate.

A seed used in the growth of a GaN crystal by an HVPE method is a GaN template obtained by growing a c-axis-oriented GaN film on a single crystal substrate different in composition from GaN, such as a sapphire substrate or a GaAs substrate, by an MOVPE (Metal Organic Vapor Phase Epitaxy) method. A GaN crystal is grown on the GaN template in the c-axis direction.

Examples of dopants used for imparting conductivity to a GaN crystal include oxygen (O). GaN is strongly facet-dependent with respect to the uptake of oxygen, and a sufficient amount of oxygen cannot be added to a GaN crystal in a growth mode where a growth surface is covered with C-plane facets. In the method described in JP-A-2002-373864 (Patent Document 1), pits are generated on the growth surface of GaN (the surface of a growing GaN crystal) growing in the c-axis direction, to expose facets other than the C-plane facets. The pits are generated by controlling growth conditions.

JP-A-2003-165799 (Patent Document 2) and JP-A-2006-66496 (Patent Document 3) disclose a method in which a dot pattern is formed on the surface of a GaN template with a growth mask in order to generate a surface pit accompanied by a core ("closed defect accumulating region").

The core is an area having no continuity with the surrounding area in terms of a crystal structure, and the typical example is a domain where the polarity of a GaN crystal is locally inverted (an inversion domain). While the growth direction of the GaN crystal is the [0001] direction (+c direction) in areas other than the inversion domain, it is the [000-1] direction (-c direction) in the inversion domain.

In Patent Document 2, a polycrystalline area, and also a crystal area partitioned from the surrounding area with grain boundaries, plane defects, aggregates of line defects, or the like, are exemplified as the cores other than the inversion domain.

PRIOR ART DOCUMENT

Patent Document

Patent Document 1: JP-A-2002-373864
Patent Document 2: JP-A-2003-165799
Patent Document 3: JP-A-2006-66496

SUMMARY OF THE INVENTION

Problem to be Solved by Invention

In the method disclosed in Patent Document 1 (JP-A-2002-373864), positions of pits to generate on the growth surface of GaN is not controlled at all. Accordingly, concentration and distribution of impurities in the GaN crystal produced by this method easily varies between production lots, and therefore it is concerned that the C-plane GaN substrate obtained from this GaN crystal may be unstable in quality.

In addition, in Patent Document 1, no interest is taken in the variation of an off-angle on a main surface of a GaN substrate at all.

When a C-plane GaN substrate is produced from a GaN crystal grown by the method disclosed in Patent Document 2 (JP-A-2003-165779) and Patent Document 3 (JP-A-2006-66496), a structure is formed where cores penetrating between two main surfaces are periodically arranged. A nitride semiconductor device formed on such a C-plane GaN substrate is strongly restricted in terms of the shape and the dimension thereof. The reason for this is that the core is a huge crystal defect and it is not preferred to form a device structure just on the core. A nitride semiconductor device formed just on the core is probably problematic in terms of at least one (often both) of characteristics and reliability.

Accordingly, an object of the present invention includes providing a C-plane GaN substrate which only mildly restricts the shape and dimension of a nitride semiconductor device formed thereon, in spite of being formed from a GaN crystal grown by a method in which pits are generated on a growth surface, and of which off-angle variation on the main surface is suppressed.

Another object of the present invention includes providing a C-plane GaN substrate which is stable in quality in spite of being formed from a GaN crystal grown by a method in which pits are generated on a growth surface, and which only mildly restricts the shape and dimension of a nitride semiconductor device formed thereon.

Means for Solving the Problem

Aspects of the present invention include a C-plane GaN substrate, a method for producing a nitride semiconductor device, and an epitaxial wafer, described below.

[a1] A C-plane GaN substrate wherein: the substrate comprises a plurality of facet growth areas each having a closed ring outline-shape on the main surface; the number density of the facet growth area accompanied by a core among the plurality of facet growth areas is less than 5 cm$^{-2}$ on the main surface; and, when any circular area of 4 cm diameter is selected from an area which is on the main surface and distant by 5 mm or more from the outer peripheral edge of the substrate, the variation widths (i.e., variation ranges) of an a-axis direction component and an m-axis direction component of an off-angle within the circular area is each 0.25 degrees or less.

[a2] A C-plane GaN substrate having a diameter of 95 to 105 mm, wherein the substrate comprises a plurality of facet growth areas each having a closed ring outline-shape on the main surface; the number density of the facet growth area accompanied by a core among the plurality of facet growth areas is less than 5 cm$^{-2}$ on the main surface; and the variation widths of an a-axis direction component and an m-axis direction component of an off-angle within an area which is on the main surface and distant by 5 mm or more from the outer peripheral edge of the substrate are each 0.5 degrees or less.

[a3] The C-plane GaN substrate according to [a1] or [a2], wherein the number density of the facet growth area accompanied by an inversion domain among the plurality of facet growth areas is 0 cm$^{-2}$ on the main surface.

[a4] The C-plane GaN substrate according to any one of [a1] to [a3], wherein the sum of the areas of all the facet growth areas present on the main surface is 70% or more of the area of the main surface.

[a5] The C-plane GaN substrate according to any one of [a1] to [a4], wherein the plurality of facet growth areas are at least partially regularly arranged.

[a6] The C-plane GaN substrate according to [a5], wherein the arrangement of the facet growth areas regularly arranged among the plurality of facet growth areas is a square lattice arrangement.

[a7] The C-plane GaN substrate according to [a5], wherein the arrangement of the facet growth areas regularly arranged among the plurality of facet growth areas is a triangle lattice arrangement.

[a8] The C-plane GaN substrate according to any one of [a1] to [a7], wherein the substrate comprises a GaN crystal grown by use of a seed with a dot mask arranged on the surface of the seed.

[a9] The C-plane GaN substrate according to any one of [a1] to [a8], wherein the oxygen concentration is 5×10$^{17}$ cm$^{-3}$ or more in at least a part of the facet growth area.

[a10] The C-plane GaN substrate according to any one of [a1] to [a9], wherein the substrate is added with either or both of silicon and germanium.

[a11] The C-plane GaN substrate according to any one of [a1] to [a10], wherein the substrate has an electrical resistivity of 0.1 Ω·cm or less.

[a12] A method for producing a nitride semiconductor device, comprising a step of preparing the C-plane GaN substrate according to any one of [a1] to [a11], and a step of epitaxially growing at least one nitride semiconductor layer on the prepared C-plane GaN substrate.

[a13] An epitaxial wafer, comprising the C-plane GaN substrate according to any one of [a1] to [a11], and at least one nitride semiconductor layer arranged on the C-plane GaN substrate.

[b1] A C-plane GaN substrate wherein: the substrate comprises a plurality of facet growth areas each having a closed ring outline-shape on the main surface; the number density of the facet growth area accompanied by a core among the plurality of facet growth areas is less than 5 cm$^{-2}$ on the main surface; and the plurality of facet growth areas are at least partially regularly arranged.

[b2] The C-plane GaN substrate according to [b1], wherein the number density of the facet growth area accompanied by an inversion domain among the plurality of facet growth areas is 0 cm$^{-2}$ on the main surface.

[b3] The C-plane GaN substrate according to [b1] or [b2], wherein the arrangement of the facet growth areas regularly arranged among the plurality of facet growth areas is a square lattice arrangement.

[b4] The C-plane GaN substrate according to [b1] or [b2], wherein the arrangement of the facet growth areas regularly arranged among the plurality of facet growth areas is a triangle lattice arrangement.

[b5] The C-plane GaN substrate according to any one of [b1] to [b4], wherein the sum of the areas of all the facet growth areas present on the main surface is 70% or more of the area of the main surface.

[b6] The C-plane GaN substrate according to any one of [b1] to [b5], wherein the substrate comprises a GaN crystal grown by use of a seed with a dot mask arranged on the surface of the seed.

[b7] The C-plane GaN substrate according to any one of [b1] to [b6], wherein the oxygen concentration is 5×10$^{17}$ cm$^{-3}$ or more in at least a part of the facet growth area.

[b8] The C-plane GaN substrate according to any one of [b1] to [b7], wherein the substrate is added with either or both of silicon and germanium.

[b9] The C-plane GaN substrate according to any one of [b1] to [b8], wherein the substrate has an electrical resistivity of 0.1 Ω·cm or less.

[b10] A method for producing a nitride semiconductor device, comprising a step of preparing the C-plane GaN substrate according to any one of [b1] to [b9], and a step of epitaxially growing at least one nitride semiconductor layer on the prepared C-plane GaN substrate.

[b11] An epitaxial wafer comprising the C-plane GaN substrate according to any one of [b1] to [b9], and at least one nitride semiconductor layer arranged on the C-plane GaN substrate.

[c1] A C-plane GaN substrate: wherein the substrate comprises a GaN crystal grown by use of a seed with a dot mask arranged on the surface of the seed; the substrate comprises a plurality of facet growth areas each having a closed ring outline-shape on the main surface; and the number density of the facet growth area accompanied by a core among the plurality of facet growth areas is less than 5 cm$^{-2}$ on the main surface.

[c2] The C-plane GaN substrate according to [c1], wherein the number density of the facet growth area accompanied by an inversion domain among the plurality of facet growth areas is 0 cm$^{-2}$ on the main surface.

[c3] The C-plane GaN substrate according to [c1] or [c2], wherein the substrate comprises a GaN crystal grown by use of a seed with dot masks regularly arranged on the surface of the seed.

[c4] The C-plane GaN substrate according to [c1] or [c2], the substrate comprises a GaN crystal grown by use of a seed with dot masks arranged into a square lattice on the surface of the seed.

[c5] The C-plane GaN substrate according to [c1] or [c2], wherein the substrate comprises a GaN crystal grown by use of a seed with dot masks arranged into a triangle lattice on the surface of the seed.

[c6] The C-plane GaN substrate according to any one of [c1] to [c5], wherein the sum of the areas of all the facet growth areas present on the main surface is 70% or more of the area of the main surface.

[c7] The C-plane GaN substrate according to any one of [c1] to [c6], wherein, when any circular area of 4 cm diameter is selected from an area which is on the main surface and distant by 5 mm or more from the outer peripheral edge of the substrate, the variation widths of an a-axis direction component and an m-axis direction component of an off-angle within the circular area is each 0.3 degrees or less.

[c8] The C-plane GaN substrate according to any one of [c1] to [c6], having a diameter of 95 to 105 mm, wherein the variation widths of an a-axis direction component and an m-axis direction component of an off-angle within an area which is on the main surface and distant by 5 mm or more from the outer cperipheral edge of the substrate are each 0.6 degrees or less.

[c9] The C-plane GaN substrate according to any one of [c1] to [c8], wherein the oxygen concentration is $5 \times 10^{17}$ cm$^{-3}$ or more in at least a part of the facet growth area.

[c10] The C-plane GaN substrate according to any one of [c1] to [c9], wherein the substrate is added with either or both of silicon and germanium.

[c11] The C-plane GaN substrate according to any one of [c1] to [c10], wherein the substrate has an electrical resistivity of 0.1 Ω·cm or less.

[c12] A method for producing a nitride semiconductor device, comprising a step of preparing the C-plane GaN substrate according to any one of [c1] to [c11], and a step of epitaxially growing at least one nitride semiconductor layer on the prepared C-plane GaN substrate.

[c13] An epitaxial wafer, comprising the C-plane GaN substrate according to any one of [c1] to [c11], and at least one nitride semiconductor layer arranged on the C-plane GaN substrate.

EFFECT OF THE INVENTION

A C-plane GaN substrate according to one aspect of the present invention only mildly restrict the shape and the dimension of a nitride semiconductor device formed on the substrate, in spite of being formed from a GaN crystal grown by a method in which pits are generated on a growth surface, and has a suppressed variation of an off-angle on the main surface.

A C-plane GaN substrate according to another aspect of the present invention is stable in quality and only mildly restricts the shape and dimension of a nitride semiconductor device formed on the substrate, in spite of being formed from a GaN crystal grown by a method in which pits are generated on a growth surface.

BRIEF DESCRIPTION OF THE DRAWINGS

FIGS. 3A and 3B are drawings illustrating arrangement examples of dot masks, with FIG. 3A and FIG. 3B illustrating a square lattice arrangement and a triangle lattice arrangement, respectively.

FIGS. 4A and 4B are drawings illustrating lattice pattern examples, with FIG. 4A and FIG. 4B illustrating a square lattice and a triangle lattice, respectively.

DESCRIPTION OF EMBODIMENTS

In a GaN crystal, a crystal axis parallel to [0001] is called a "c-axis", a crystal axis parallel to <10-10> is called an "m-axis", and a crystal axis parallel to <11-20> is called an "a-axis". In addition, a crystal plane perpendicular to the c-axis is called a "C-plane", a crystal plane perpendicular to the m-axis is called an "M-plane", and a crystal plane perpendicular to the a-axis is called an "A-plane".

Herein, references to a crystal axis, a crystal plane, a crystal orientation, and the like mean references to a crystal axis, a crystal plane, a crystal orientation, and the like of a GaN crystal, respectively, unless otherwise noted.

Hereinafter, the present invention is described in detail with reference to specific embodiments.

1. C-Plane GaN Substrate

Figure 1A:
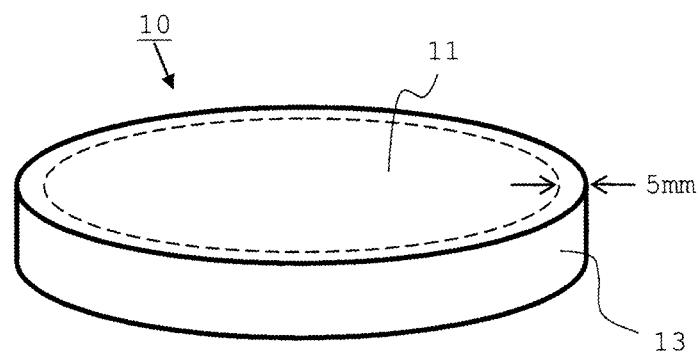
FIGS. 1A and 1B are drawings each illustrating one example of a C-plane GaN substrate of the present invention, with FIG. 1A being a perspective view, and FIG. 1B being a side view.
Figure 1B:
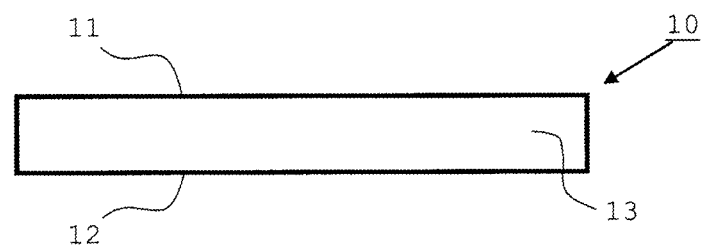

The C-plane GaN substrate of the present invention typically has a disk shape as illustrated in FIGS. 1A and 1B. FIG. 1A is a perspective view and FIG. 1B is a side view.

With reference to FIGS. 1A and 1B, a C-plane GaN substrate 10 has a gallium polar surface 11 which is a main surface on the [0001] side, a nitrogen polar surface 12 which is amain surface on the [000-1] side, and a side surface 13. A broken line drawn on the gallium polar surface 11 represents a boundary between an area less than 5 mm and an area 5 mm or more in distance from the outer peripheral edge of the substrate.

The diameter of the C-plane GaN substrate 10 is 45 mm or more, may be 50 mm or more, and is usually 305 mm or less. Typical diameters include 45 to 55 mm (about 2 inches), 95 to 105 mm (about 4 inches), 145 to 155 mm (about 6 inches), and 195 to 205 mm (about 8 inches).

The C-plane GaN substrate is required to have a strength so that any disadvantage is not caused in handling, and the thickness thereof is thus preferably 250 μm or more, more preferably 300 μm or more. The thickness may also be further increased depending on the diameter.

Beveling for smoothing the boundary between the gallium polar surface 11 and the side surface 13 may be appropriately performed, if necessary. Much the same is true on the boundary between the nitrogen polar surface 12 and the side surface 13.

The C-plane GaN substrate 10 may be further provided with not only an orientation flat representing a crystal orientation, but also a marking such as an index flat in order to facilitate identification of the gallium polar surface 11 and the nitrogen polar surface 12.

While the main surface of the C-plane GaN substrate 10 may be parallel to the C-plane of a GaN crystal, it may be preferably slightly tilted from the C-plane. The angle of such tilt is referred to as the "off-angle".

When the gallium polar surface is tilted from a (0001) plane, a preferable tilt direction is a direction within a range of ±5° relative to a <10-10> direction, or a direction within a range of ±5° relative to a <11-20> direction. The absolute value of the off-angle is usually 0.1 degrees or more, preferably 0.2 degrees or more, and is usually 10 degrees or less, preferably 2 degrees or less, more preferably 1 degree or less.

The off-angle of the GaN substrate 10 may be measured by an X-ray diffraction method.

The C-plane GaN substrate of the present invention has a plurality of facet growth areas each having a closed ring outline-shape, on the main surface thereof.

Figure 2A:
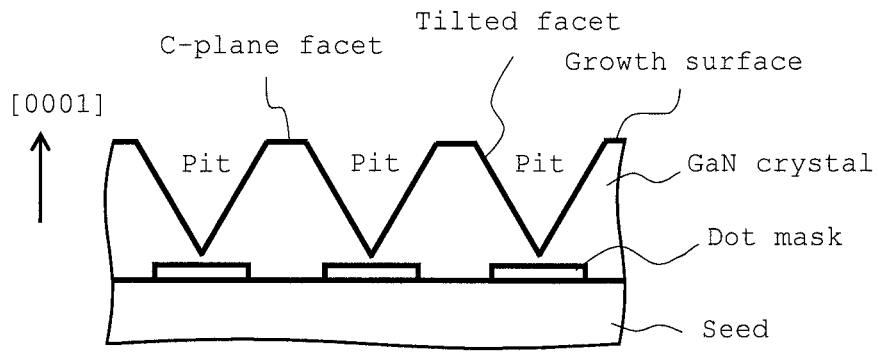
FIGS. 2A to 2C are drawings each describing how facet growth areas are formed.

The definition of the facet growth area and how the facet growth area is formed are described with reference to FIGS. 2A to 2C.

A GaN crystal forming the C-plane GaN substrate of the present invention is produced by growing GaN on a seed in the c-axis direction. The surface of the seed is provided with dot masks, and pits are generated on the growth surface of a GaN crystal (the surface of a growing GaN crystal) at the initial stage of growth due to the action of the dot masks, as illustrated in FIG. 2A.

Tilted facets which are facets other than C-plane facets are exposed in the pits. The tilted facets are tilted relative to the C-plane. Examples of the tilted facets include, but are not limited, {n n-2nk} facets such as {11-22} facets and {11-21} facets, and {n0-nk} facets such as {10-11} facets and {10-12} facets (where n and k each represent an integer).

Facets exposed to areas other than the pits are C-plane facets.

Figure 2B:
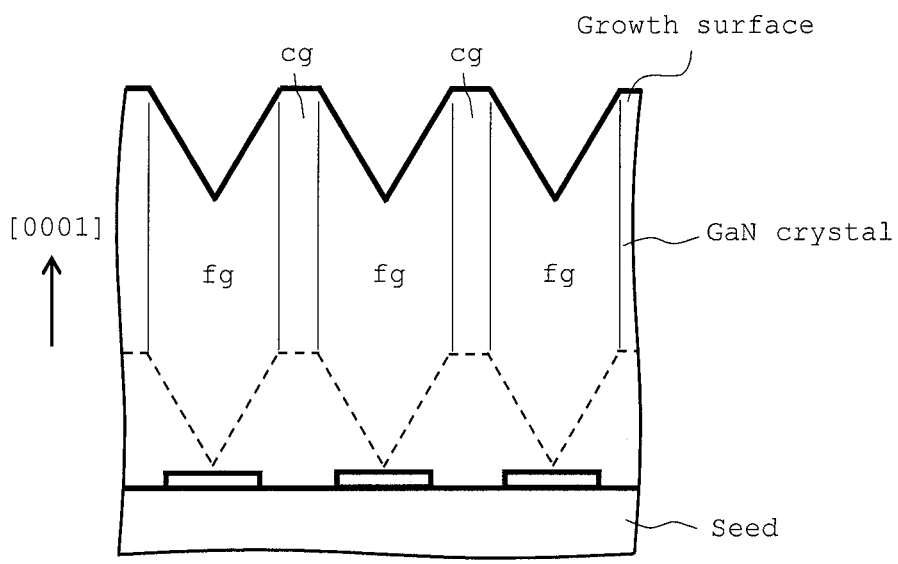

By growing with pits kept present on a growth surface, a GaN crystal comprising facet growth portions fg and C-plane growth portions cg is formed as illustrated in FIG. 2B. The facet growth portion fg corresponds to a portion formed by growth on a tilted facet, and the C-plane growth portion cg corresponds to a portion formed by growth on a C-plane facet.

It is noted that, when a GaN crystal actually grows, the dimensions of the pits are not constant as illustrated in FIG. 2B and may be varied. Some pits may become larger and some pits may become smaller as a GaN crystal grows, probably due to the difference in a local environment.

Figure 2C:
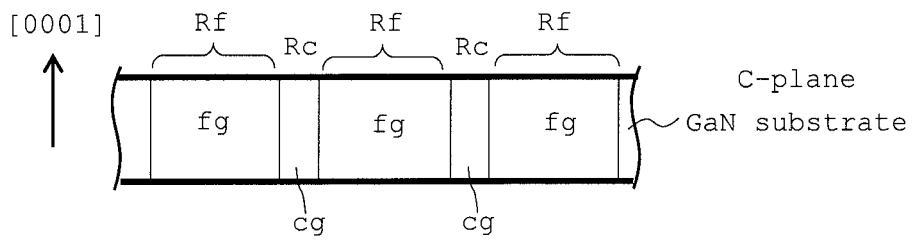

When the GaN crystal comprising the facet growth portions fg and the C-plane growth portions cg is processed, a C-plane substrate having facet growth areas Rf and C-plane growth areas Rc on a main surface thereof is obtained as illustrated in FIG. 2C. The facet growth area Rf corresponds to an area where the facet growth portion fg is exposed and the C-plane growth area Rc corresponds to an area where the C-plane growth portion cg is exposed. The facet growth portion fg and the C-plane growth portion cg are exposed to both of the gallium polar surface and the nitrogen polar surface.

As can be understood from the formation mechanism described above, the outline of the facet growth area has a closed ring shape reflecting the shape of the pit formed on the growth surface of the GaN crystal. While the facet growth areas Rf often have an outline shape close to a circle or a regular polygon, these may also have a deformative shape, for example, where coalescence or the like between the pits has occurred during crystal growth.

Almost all of the plurality of facet growth areas observed on the main surface of the C-plane GaN substrate of the present invention are each a facet growth area which is not accompanied by a core. Most preferably, no facet growth area accompanied by a core is present. Even if present, the number density thereof is usually less than 5 $cm^{-2}$, preferably less than 4 $cm^{-2}$, more preferably less than 2 $cm^{-2}$, still more preferably less than 1 $cm^{-2}$, still more preferably less than 0.5 $cm^{-2}$. Particularly preferably, no facet growth area accompanied by an inversion domain is present, namely, the number density of such facet growth area is 0 $cm^{-2}$.

The term "core" means a characteristic structure which the C-plane GaN substrate disclosed in Patent Document 2 and Patent Document 3 has, and refers to an area having no continuity with the surrounding area in terms of the crystal structure. The core not only includes an inversion domain and a polycrystalline area, but also a crystal area partitioned from the surrounding area with defects or an aggregate of defects. The core can be confirmed by a cathode luminescence image or the like, as described below. The inversion domain and the polycrystalline area can also be detected by utilizing a phenomenon in which they exhibit a different shape from that of the surroundings when they are etched.

Thus, in the C-plane GaN substrate of the present invention, a facet growth area accompanied by a core is not present, or even if present, there are very few, and restrictions on the shape and dimension of a nitride semiconductor device formed on the substrate can therefore be less restricted.

In the C-plane GaN substrate of the present invention, the plurality of facet growth areas observed on the main surface may be at least partially regularly disposed. Such a structure is associated with a surface pit generation method used in growing the GaN crystal forming the substrate.

As described above, the GaN crystal forming the C-plane GaN substrate of the present invention is grown on the seed with dot masks provided on the surface of the seed. The surface pits are generated one by one over every dot mask. Accordingly, when the dot masks are regularly aligned, pits regularly aligned as the dot masks are generated on the growth surface of GaN.

When the dot mask pitch is relatively large, such as 500 μm or more, the arrangement of the pits is reflected on the arrangement of facet growth portions formed in the GaN crystal, and further reflected on the arrangement of facet growth areas on the main surface of the C-plane GaN substrate.

Thus, such a regular arrangement of facet growth areas which may be observed on the main surface of the C-plane GaN substrate of the present invention is a trace indicating that a seed with dot masks regularly arranged on the surface of the seed has been used in growing the GaN crystal forming the substrate.

Accordingly, an area where facet growth areas are arranged into a square lattice may be observed on the main surface of the C-plane GaN substrate comprising a GaN crystal grown by using a seed having dot masks arranged into a square lattice, and an area where facet growth areas are arranged into a triangle lattice may be observed on the main surface of the C-plane GaN substrate comprising a GaN crystal grown by using a seed having dot masks arranged into a triangle lattice.

The square lattice arrangement here means an arrangement illustrated in FIG. 3A, and dots are positioned at lattice positions of a square lattice. The square lattice here means a lattice pattern where squares having the same sizes are combined, as illustrated in FIG. 4A. The lattice position here means a position where straight lines forming the lattice pattern intersect with each other.

The triangle lattice arrangement here means an arrangement illustrated in FIG. 3B, and dots are positioned at lattice positions of a triangle lattice. The triangle lattice here means a lattice pattern where regular triangles having the same sizes are combined, as illustrated in FIG. 4B.

The dot masks act to generate pits at a very initial stage of crystal growth, and some pits generated may disappear in the course of the subsequent crystal growth or may become larger in size through coalescence with an adjacent pit. Therefore, in many cases, the facet growth areas are only partially arranged regularly on the main surface of the C-plane GaN substrate of the present invention.

The shape and the arrangement of the facet growth areas on the main surface of the C-plane GaN substrate can be examined by use of, for example, a fluorescence microscope. When visible light observation is performed by a fluorescence microscope, the facet growth area appears dark and the C-plane growth area appears bright.

The arrangement of the facet growth areas can also be seen from a carrier concentration mapping image obtained based on microscopic Raman spectrometry. The carrier concentration tends to become higher from the center towards the outer periphery in the facet growth area. Therefore, in the carrier concentration mapping image, the outline of each of the facet growth areas can be observed in an area where they are in contact with each other.

The facet growth area and the C-plane growth area are slightly different in etching rate, and therefore when a process for finishing the main surface includes CMP or etching, nanoscale steps may be formed between the facet growth areas and the C-plane growth areas. With respect to a C-plane GaN substrate with such steps formed, the arrangement of the facet growth areas can be examined from an optical image obtained by use of a semiconductor wafer surface inspection apparatus which enables detecting fine unevenness on a flat surface. One example of the semiconductor wafer surface inspection apparatus which may be used for such a purpose is "Supermacro SM75" available from Softworks Co., Ltd.

In the C-plane GaN substrate of the present invention, the sum of the areas of all the facet growth areas present on the main surface is preferably 70% or more of the area of the main surface. The ratio is more preferably 80% or more, still more preferably 90% or more.

The facet growth areas present on the main surface not only include those derived from the pits generated by the action of the dot masks, but also include those derived from pits spontaneously generated without the action of the dot masks.

In the C-plane GaN substrate of the present invention, an oxygen concentration in the facet growth areas may be $5 \times 10^{17}$ cm$^{-3}$ or more, and even $1 \times 10^{18}$ cm$^{-3}$ or more. On the other hand, it is difficult to increase an oxygen concentration in the C-plane growth areas to the order of $10^{17}$ cm$^{-3}$.

The term "oxygen concentration" here means an oxygen concentration measured at a depth of about 1 μm from the surface. Such an oxygen concentration can be measured by Dynamic-SIMS (Secondary Ion Mass Spectroscopy).

Into the C-plane GaN substrate of the present invention, n-type impurities such as silicon (Si) and germanium (Ge) may be added in order to compensate for deficiency of the carrier concentration in the C-plane growth areas. For example, the concentration of silicon in the C-plane growth area can reach the order of $10^{18}$ cm$^{-3}$.

The electrical resistivity of the C-plane GaN substrate of the present invention is usually 0.1 Ω·cm or less, preferably 0.05 Ω·cm or less, more preferably 0.02 Ω·cm or less. Doping a GaN crystal to an extent such that the electrical resistivity thereof is less than 0.001 Ω·cm may deteriorate the crystallinity and heat conductivity thereof.

The off-angle of the C-plane GaN substrate can be decomposed into an a-axis direction component and an m-axis direction component. This can be easily understood by expressing the off-angle as the tilt angle of the normal vector of the main surface with respect to the c-axis as a reference.

Figure 5:
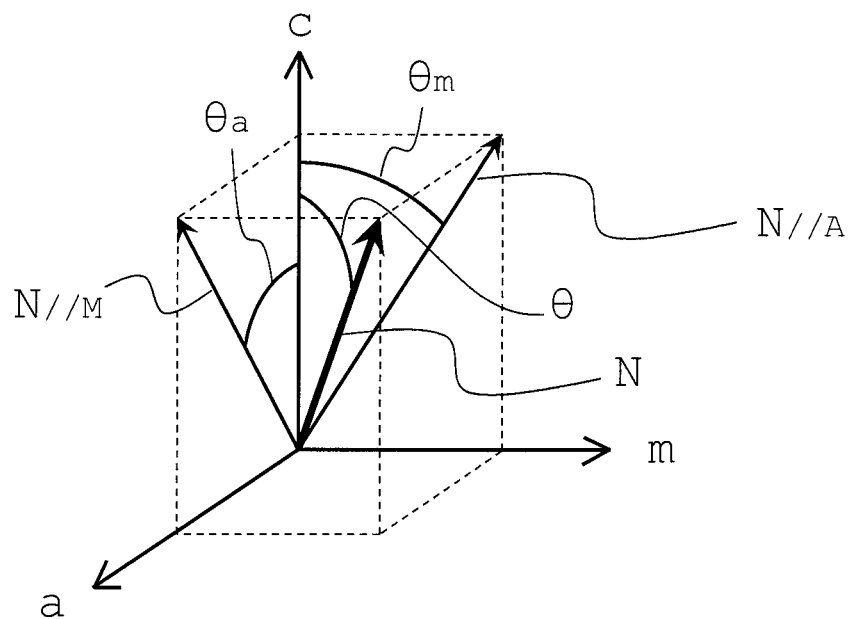
FIG. 5 is a drawing describing a relation of the off-angle θ of the C-plane GaN substrate with the a-axis direction component $θ_a$ and the m-axis direction component $θ_m$ thereof.

As described with reference to FIG. 5, a normal vector N of the main surface of the C-plane GaN substrate having an off-angle θ can be decomposed into an M-plane parallel component $N_{//M}$ and an A-plane parallel component $N_{//A}$. The M-plane parallel component $N_{//M}$ corresponds to the orthogonal projection of the normal vector N on the M-plane, and the A-plane parallel component $N_{//A}$ corresponds to the orthogonal projection of the normal vector N on the A-plane.

When the normal vector N is thus decomposed, the tilt of the M-plane parallel component $N_{//M}$ relative to the c-axis corresponds to an a-axis direction component $θ_a$ of the off-angle θ and the tilt of the A-plane parallel component $N_{//A}$ relative to the c-axis corresponds to an m-axis direction component $θ_m$ of the off-angle θ.

It is important for a GaN substrate to have only a small variation in the off-angle on the main surface. The reason for this is that the off-angle of the GaN substrate has an extremely large influence on the quality of a nitride semiconductor film epitaxially grown on the main surface.

Accordingly, in the C-plane GaN substrate of the present invention, when any circular area of 4 cm diameter is selected from an area which is on the main surface and distant by 5 mm or more from the outer peripheral edge of the substrate, the variation widths of an a-axis direction component and an m-axis direction component of an off-angle within the circular area are each preferably 0.25 degrees or less, further preferably 0.2 degrees or less, further preferably 0.1 degrees or less.

When the C-plane GaN substrate of the present invention has a diameter of 95 to 105 mm (about 4 inches), the variation width of an off-angle within an area which is on the main surface and distant by 5 mm or more from the outer peripheral edge of the substrate is preferably 0.5 degrees or less, more preferably 0.4 degrees or less, still more preferably 0.2 degrees or less, with respect to both the a-axis direction component and the m-axis direction component.

The "variation width of an a-axis direction component of an off-angle" here means $2Δθ_a$ when the median, the maximum and the minimum of the a-axis direction component are respectively referred to as $θ_a$, $θ_a+Δθ_a$ and $θ_a-Δθ_a$. Similarly, the "variation width of an m-axis direction component of an off-angle" here means $2Δθ_m$ when the median, the maximum and the minimum of the m-axis direction component are respectively referred to as $θ_m$, $θ_m+Δθ_m$ and $θ_m-Δθ_m$. The angles $θ_a$ and $θ_m$ may be each 0°.

2. Method for Producing C-Plane GaN Substrate

A method for producing a C-plane GaN substrate, which may be suitably used for production of the C-plane GaN substrate of the present invention, is described below.

2.1. Preparation of Seed

A GaN template obtained by growing a c-axis-oriented GaN film on a C-plane sapphire substrate by an MOVPE method is prepared. The dimension (diameter) of the GaN template may be appropriately selected depending on the dimension of a C-plane GaN substrate to be produced.

Next, a selective growth mask is formed on the main surface (GaN film surface) of the GaN template. The material of the selective growth mask may be a material which can inhibit a GaN crystal from starting to grow, and includes, for example, an oxide, nitride or oxynitride of a metal. Preferable examples include silicon oxide, silicon nitride, and silicon oxynitride.

The selective growth mask may be formed by forming a thin film made of the above material, having a thickness of 50 to 150 nm, by a method such as plasma CVD, vacuum evaporation, and sputtering, and thereafter patterning the thin film using photolithography and etching technique.

The selective growth mask is formed into a pattern comprising dot masks.

The dot mask, when having a maximum width of 10 μm, can allow a pit to be generated on the surface of a GaN crystal growing on a seed, by the action thereof. The maximum width of the dot mask may be 15 μm or more, 30 μm or more, and even 50 μm or more.

The "maximum width of the dot mask" here means a width in a direction in which the width is maximum. For example, the width of a circle is constant regardless of a direction, and therefore the maximum width of a circle is equal to the diameter thereof. The maximum width of a regular polygon having an even number of sides is equal to the diameter of a circumscribed circle thereof.

The shape of the dot mask is, for example, a circle or a regular polygon, but is not limited thereto. The influence of the shape of the dot mask on the shape of surface pit to be generated thereover is not confirmed. In order to prevent occurrence of anomalous growth, however, a circle or a shape close to a circle (for example, regular hexagon, regular octagon, or regular dodecagon) is preferable.

The maximum width of the dot mask is usually 200 μm or less, preferably 150 μm or less, more preferably 100 μm or less. A too large size of the dot mask causes anomalous growth of a GaN crystal.

The arrangement of the dot masks included in the selective growth mask is preferably a square lattice arrangement illustrated in FIG. 3A or a triangle lattice arrangement illustrated in FIG. 3B, but is not limited thereto.

Figures 6A, 6B:
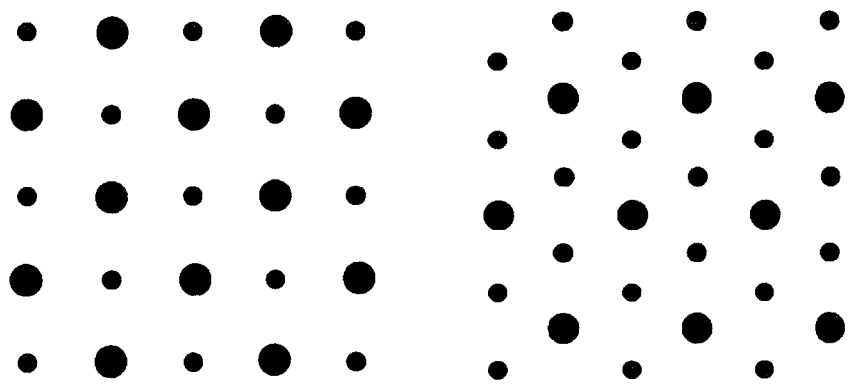
FIGS. 6A and 6B are drawings each illustrating a mode of coexistence of dot masks different in dimension.

It is not essential that the dimensions of the dot masks are uniform, and, for example, dot masks different in dimension from each other may coexist as illustrated in FIGS. 6A and 6B. In FIG. 6A, two types of dot masks: large and small dot masks; are arranged alternatingly at lattice positions of a square lattice. FIG. 6B illustrates one example of a pattern in which dot masks arranged into a triangle lattice comprise large dot masks and small dot masks.

When the ratio of the area occupied by the dot masks in the selective growth mask is high, and for example, is more than 10%, an anomalousness called a "polytype" easily occurs on GaN grown on a seed. Accordingly, when the mask pattern is designed, it is desirable to adjust the number density of dots so that, while the dimension of the dot mask is in the preferable range mentioned above, the area ratio is 5% or less, 2% or less, and even 1% or less.

For example, when circular dot masks each having a diameter of 100 μm are arranged into a square lattice, the area of one dot mask is $7.85 \times 10^{-5}$ cm$^2$, and therefore, the area ratio of the dot masks is about 2% provided that their number density (=density of lattice positions) is 250 cm$^{-2}$. In order that the number density of the dot masks is set to 250 cm$^{-2}$, the interval between the closest lattice positions in a square lattice, namely, the length of one side of a square as a unit lattice may be 632 μm.

According to the findings by the present inventors, when the selective growth mask consists only of the dot masks mentioned above, the dislocation density (spiral dislocation, edge dislocation, mixed dislocation) in the GaN crystal grown on the seed tends to be higher, and the variation width of an off-angle on the main surface tends to be larger in the C-plane GaN substrate obtained by processing the grown GaN crystal. In addition thereto, when the selective growth mask consists only of the dot masks mentioned above, the grown GaN crystal is strongly adhered to the seed, and therefore the GaN crystal is difficult to separate from the seed without any occurrences of cracking and chipping.

Therefore, the selective growth mask is recommended to have a hybrid pattern formed by superposing a first pattern which is a pattern consisting of the dot masks mentioned above and a second pattern which is a finer pattern than the first pattern. In other words, the second pattern is provided in a blank area (an area where no dot masks are present) of the first pattern.

One example of the second pattern is a net pattern. Specific example of the net pattern is illustrated in FIGS. 7A to 7E.

Figure 7A:
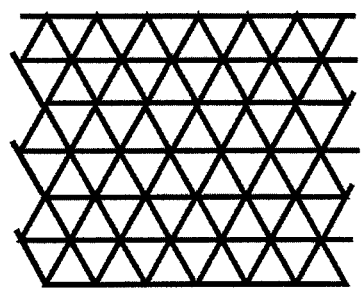
FIGS. 7A to 7E are drawings each illustrating a net pattern example.
Figure 7B:
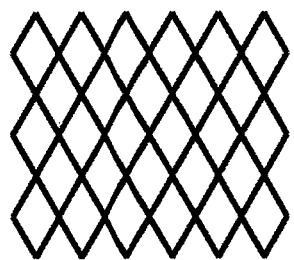
Figure 7C:
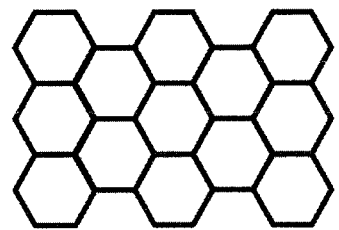
Figure 7D:
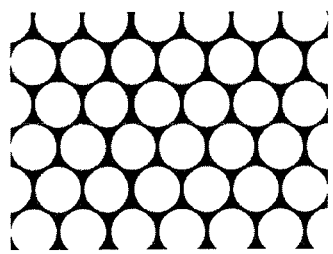
Figure 7E:
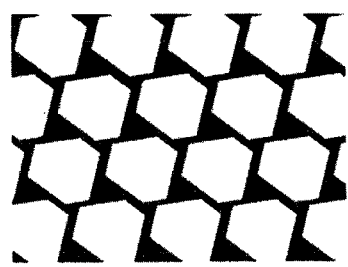

FIG. 7A, FIG. 7B, and FIG. 7C illustrate a triangle lattice net, a rhombus lattice net, and a hexagon lattice net, respectively. The net pattern in FIG. 7D has circular openings. The net pattern in FIG. 7E has a hexagonal opening of which all the inner angles are each 120° and which is not a regular hexagon.

Figure 8A:
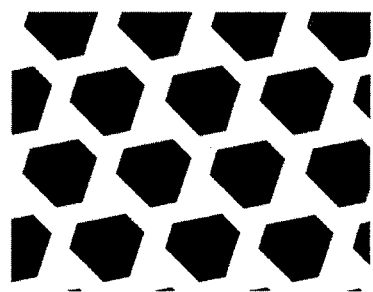
FIGS. 8A to 8C are drawings each illustrating a dot pattern example.
Figure 8B:
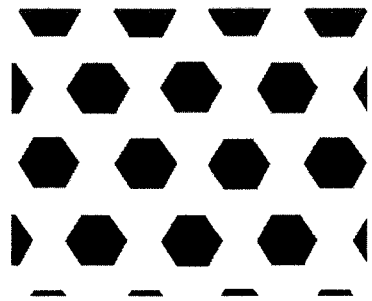
Figure 8C:
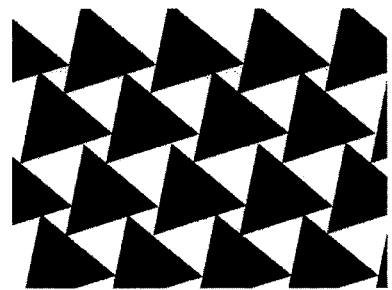

Another example of the second pattern is a dot pattern. Specific examples of the dot pattern are illustrated in FIGS. 8A to 8C. The arrangements of dots in FIGS. 8A to 8C are all triangle lattice arrangements, but the shapes of the dot are different, and the shape in FIG. 8A is a hexagon which is not a regular hexagon, the shape in FIG. 8B is a regular hexagon, and the shape in FIG. 8C is a regular triangle. In FIG. 8C, each dot is in point contact with adjacent dots.

Examples of the dot pattern may include not only patterns illustrated in FIGS. 8A to 8C, but also a pattern in which the arrangement of dots is a hexagon lattice arrangement, and a pattern in which the shape of the dot is a circle, a dodecagon, or the like. The combination of the arrangement and the shape of dots is not limited.

Figure 9:
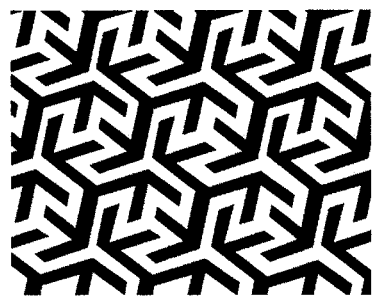
FIG. 9 is a drawing illustrating a complicated pattern example.

Furthermore, the second pattern may be a complicated pattern as illustrated in FIG. 9.

The second pattern is a finer pattern than the first pattern.

The period of the second pattern is preferably one-tenth or less, more preferably one-fifteenth or less of the period of the first pattern.

Furthermore, the period of the second pattern is preferably 30 μm or less, more preferably 20 μm or less, regardless of the period of the first pattern.

The width of the line or dot forming the second pattern may be one-third or less, one-fifth or less, and even one-tenth or less of the width of the dot mask forming the first pattern.

Whatever value the width of the dot mask forming the first pattern is, the width of the line or dot forming the second pattern is preferably 5 μm or less, more preferably 3 μm or less.

On the other hand, the width of the line or dot forming the second pattern is usually 0.5 μm or more, preferably 1 μm or more. If the width is too small, not only the cost of photolithography processes is higher, but also the probability of occurrence of defects in the second pattern is higher. The defect which occurs in the second pattern causes anomalous growth of a GaN crystal.

When the second pattern is designed, the period thereof, and the width of the line or dot forming the pattern are preferably in the above preferable ranges, and the opening ratio (the ratio of the area occupied by the openings in the second pattern) is preferably 50% or less, more preferably 40% or less. The lower limit of the opening ratio of the second pattern is 20%. When the opening ratio is less than such a value, an anomalous growth called a polytype easily occurs in the GaN crystal growing on the seed.

The opening ratio of the second pattern is in the above preferable range to thereby alleviate the problem of strong adherence of the grown GaN crystal to the seed.

2.2. Growth of GaN Crystal

A GaN crystal is grown in the c-axis direction by an HVPE method using as a seed the GaN template with the selective growth mask arranged on the main surface prepared in 2.1. above.

As an HVPE apparatus, an apparatus equipped with a hot-wall type quartz reactor may be preferably used. An HCl (hydrochloric acid) gas is supplied to a Ga boat located in the reactor, and HCl is allowed to react with metallic Ga to produce a GaCl gas. The GaCl gas is allowed to react with an $NH_3$ (ammonia) gas separately supplied into the reactor through a piping, and produced GaN is epitaxially grown on a seed located in another place in the reactor.

The growth temperature at the initial stage of growth including the beginning of growth is preferably 980° C. or more, more preferably 985° C. or more. When the growth temperature is low, inversion domain formation becomes easier, and in particular, when the growth temperature is 970° C. or less, an inversion domain may be formed over every dot mask.

The growth temperature after generation of pits on the growth surface may be set so that the presence of such pits is maintained, and the temperature is preferably 980 to 1100° C., although not limited thereto.

When the growth rate immediately after the beginning of growth is too high, a facet growth portion accompanied by a certain type of core is easily formed. That is the core comprising a crystal area having an anomalously high dislocation density, partitioned from the surrounding area by defects or an aggregate of defects.

Figure 10:
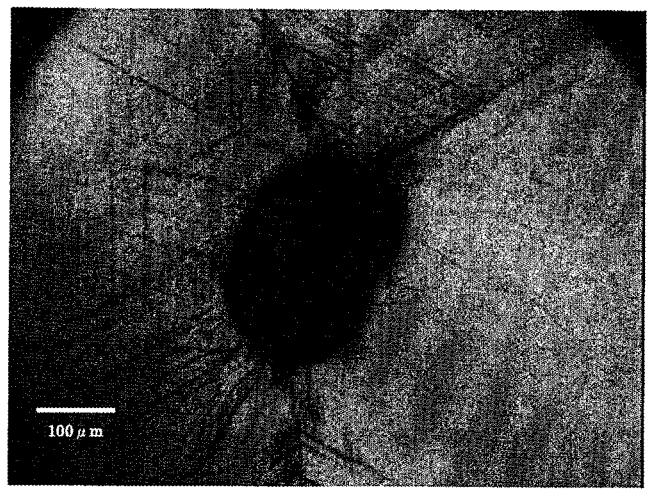
FIG. 10 is a cathode luminescence image of a certain type of core.

FIG. 10 illustrates a cathode luminescence image of an area where this type of core is exposed on the main surface of the C-plane GaN substrate. An outline formed of a non-emitting portion is observed, and the core and the surrounding area thereof can be clearly distinguished.

In order to prevent occurence of this type of core, it is effective to provide, before a main growth step of growing a thick GaN crystal, an initial growth step in which growth temperature is lowered than the main growth step to decrease the growth rate, thereby performing two-stage (or multistage) growth. It is, however, to be noted that when the temperature at the begginng of growth is 970° C. or less, an inversion domain type of core is easily formed.

In a preferable example, (i) an initial growth step, (ii) a first intermediate growth step in which the same growth temperature as in a main growth step is used, (iii) a second intermediate growth step in which the same growth temperature as in the initial growth step is used, and (iv) a main growth step may be sequentially performed. When such a temperature profile is adopted, an advantage is that not only an occurrence of the core mentioned above can be prevented, but also the variation width of an off-angle within the main surface becomes smaller in the C-plane GaN substrate obtained by processing of the grown GaN crystal.

The GaN crystal is usually grown until the distance from the bottom of the pit formed on the growth surface to the surface of the seed reaches 1 mm or more. There is no upper limit of the growth thickness, and the GaN crystal may be grown until the distance reaches 5 mm or more.

When a quartz reactor is used, the growing GaN crystal is doped with oxygen even when an oxygen-containing gas is not intentionally supplied. Oxygen is mainly incorporated in facet growth portions.

When the oxygen concentration in the GaN crystal is insufficient by relying only on the auto-doping, an oxygen gas ($O_2$) is supplied into the reactor.

Conversely, when the oxygen concentration of the GaN crystal is required to be reduced, a liner pipe made of BN (boron nitride), SiC (silicon carbide), or the like is arranged in the reactor, and the seed is arranged inside the pipe to thereby inhibit an oxygen-containing gas generated from the reactor from reaching the seed.

When the GaN crystal is doped with silicon, chlorosilane ($SiH_3Cl$, $SiH_2Cl_2$, $SiHCl_3$, $SiCl_4$), or fluorosilane is preferably supplied as a doping gas to the reactor.

When the GaN crystal is doped with germanium, tetrachlorogermane ($GeCl_4$) is preferably supplied as a doping gas to the reactor.

After an elapse of the predetermined growth time, supply of the HCl gas to the Ga boat is stopped and heating of the reactor is also stopped, thereby to stop growth of the GaN crystal and to lower the temperature of the reactor to room temperature.

When the opening ratio of the second pattern of the selective growth mask is 40% or less, the GaN crystal grown tends to be spontaneously separated from the seed during lowering of the seed temperature to room temperature.

When the GaN crystal is not spontaneously separated from the seed, a known procedure such as sawing, polishing, laser lift-off, or etching is appropriately used for the separation.

2.3. Processing of GaN Crystal

When a disk-shaped C-plane GaN substrate is produced, the GaN crystal grown in 2.2 above is subjected to grinding processing or core drilling processing, to produce an ingot having a cylindrical outer periphery. Next, this ingot is sliced parallel to or substantially parallel to the C-plane by use of a wire saw slicer or an inner peripheral blade slicer, to provide a disk-shaped wafer.

Furthermore, either or both main surfaces of the resulting wafer are finished into flat and smooth surface(s) suitable for epitaxially growing a nitride semiconductor thin film thereon.

Both of the gallium polar surface and the nitrogen polar surface may be formed into a surface suitable for epitaxial growth of a nitride semiconductor through planarization by sequentially performing grinding and lapping, and thereafter, removal of a damaged layer and smoothing by CMP (Chemical Mechanical Polishing). Processing by RIE (Reactive Ion Etching) may also be performed in addition to CMP or instead of CMP.

It is desirable to also remove a damaged layer from a main surface not to be used for epitaxial growth of a nitride semiconductor. The damaged layer on the nitrogen polar surface can be removed by wet or dry etching. The nitrogen polar surface may be formed into a mat surface by etching.

The above-described procedure provides a C-plane GaN substrate having less ununiformity of properties along a direction parallel to the main surface. The reason for this is that the selective growth mask comprising regularly aligned dot masks is provided on the seed when the GaN crystal forming the substrate is grown. The regularly aligned dot masks act to generate pits aligned regularly as the dot masks on the growth surface of the GaN crystal, resulting in uniform formation of the facet growth portions in the growing GaN crystal. Any impurity generally has different concentrations between in the facet growth portion and in the C-plane growth portion, and it is thus important to prevent the distribution of the facet growth portions in the crystal from being ununiform, in order to prevent the properties of the substrate from being ununiform.

Furthermore, the quality of the C-plane GaN substrate produced by the above-described procedure can be kept stable, when it is mass-produced. The reason for this is that the use of the same selective growth mask enables generating similarly regularly aligned pits on a GaN crystal growning on any seed, and thereby reproducibly growing GaN crystals having the facet growth portions similarly distributed.

3. Application of C-plane GaN Substrate

At least one nitride semiconductor layer may be epitaxially grown on the C-plane GaN substrate of the present invention to provide an epitaxial wafer. In this case, a nitride semiconductor device structure may be formed from the at least one nitride semiconductor layer.

The type of the nitride semiconductor device which may be formed on the C-plane GaN substrate of the present invention is not limited, and specific examples include light-emitting devices such as a light-emitting diode and a laser diode, electronic devices such as a rectifier, a bipolar transistor, a field-effect transistor, and a HEMT (High Electron Mobility Transistor), sensors such as a temperature sensor, a pressure sensor, a radiation sensor, and a visible light detector, ultraviolet light detector, a SAW (Surface Acoustic Wave) device, a transducer, a resonator, an oscillator, MEMS (Micro Electro Mechanical Systems) components, a voltage actuator, and a solar cell.

The C-plane GaN substrate of the present invention may also be used as a semiconductor electrode in an electrochemical device such as an artificial photosynthesis device.

4. Experimental Results 4.1. Experiment 1

A GaN template was prepared which comprised a C-plane sapphire substrate having a diameter of 76 mm and a c-axis-oriented GaN film having a thickness of about 3 μm epitaxially grown on the substrate by an MOCVD method. The surface of the GaN film was a gallium polar surface.

A $SiN_x$ film having a thickness of 800 Å was deposited on the surface of the GaN film of the GaN template by a plasma CVD method, and thereafter the $SiN_x$ film was patterned by use of conventional photolithography and dry etching technique, to form a selective growth mask.

The pattern of the selective growth mask was a hybrid pattern comprising the following first pattern and second pattern superposed each other.

The first pattern was a pattern consisting of regular hexagon dot masks each having a maximum width of 58 μm and arranged into a square lattice. The distance between the closest lattice positions, namely, the length of one side of a square being a unit lattice was 800 μm. Accordingly, the number density of the dot masks was 156 $cm^{-2}$, and the ratio of the area occupied by the dot masks in the selective growth mask was 0.34%.

The second pattern was a triangle lattice net pattern having a line width of 3 μm, and the period thereof was determined so that the opening ratio was 39%.

After formation of the selective growth mask, a GaN crystal was grown on the GaN template by an HVPE method. As the HVPE apparatus, an apparatus equipped with a hot-wall type quartz reactor was used. The outer periphery of the GaN template was covered with a ring, so that only an area of 70 mm diameter on the main surface of the GaN temprate was exposed.

Until 33 minutes after the beggining of epitaxial growth, conditions with a growth temperature of 986° C., a reactor pressure of 101 kPa, an ammonia partial pressure of 9.5 kPa, a GaCl partial pressure of 0.6 kPa, a hydrogen gas partial pressure of 66.7 kPa and a nitrogen gas partial pressure of 24.1 kPa were used.

Next, while the raw material gases and the carrier gases were continuously supplied, the growth temperature was raised from 986° C. to 997° C.

Next, the GaN crystal was grown for 1.5 hours under conditions with a growth temperature of 997° C., a reactor pressure of 101 kPa, an ammonia partial pressure of 9.5 kPa, a GaCl partial pressure of 1.0 kPa, a hydrogen gas partial pressure of 66.4 kPa and a nitrogen gas partial pressure of 24.1 kPa. In addition, dichlorosilane started to be supplied as a silicon doping gas into the reactor at this stage.

Next, while the flow rates of the raw material gases and the carrier gases were maintained, the growth temperature was dropped from 997° C. to 984° C.

Next, while the flow rates of the raw material gases and the carrier gases were maintained, the GaN crystal was grown for 2 hours.

Next, while the flow rates of the raw material gases and the carrier gas were maintained, the growth temperature was raised from 984° C. to 997° C.

Next, while the flow rates of the raw material gases and the carrier gases were maintained, the GaN crystal was grown for 51 hours.

After the completion of GaN crystal growth, the reactor temperature was lowered to room temperature to take out the GaN crystal grown. The GaN crystal grown was able to be separated from the GaN template by applying almost no external force.

The outer periphery of the GaN crystal was processed into a cylindrical shape and thereafter the GaN crystal was sliced to provide a C-plane wafer having a diameter of 5 cm (2 inches). The damaged layer on the nitrogen polar surface of the C-plane wafer was removed by alkali etching, and thereafter the gallium polar surface was sequentially subjected to grinding, lapping and CMP, to complete a C-plane GaN substrate.

In the alkali etching, an aqueous KOH solution heated to 80° C. was used as an etchant, and the treatment time was 30 minutes. When the substrate after the etching was observed with SEM, it was found that, while a large number of cones were densely formed on the nitrogen polar surface, no cones were formed on the gallium polar surface at all. It was confirmed from this finding that the C-plane GaN substrate of Experiment 1 was free from any inversion domain.

Figure 11A:
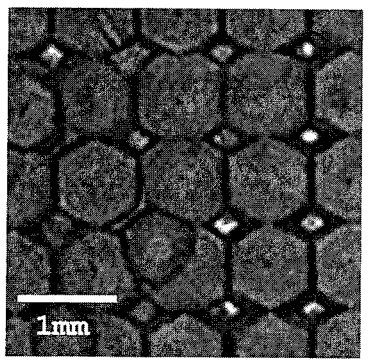
FIGS. 11A and 11B are each an optical image of a gallium polar surface of a C-plane GaN substrate.
Figure 11B:
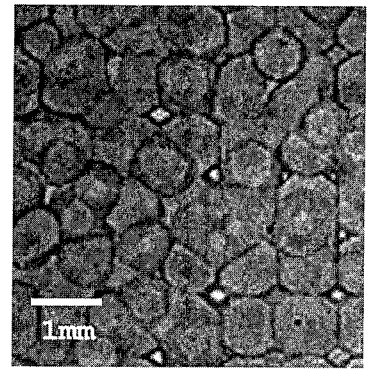

FIGS. 11A and 11B each illustrate an optical image example of the gallium polar surface of the C-plane GaN substrate of Experiment 1, obtained by use of a semiconductor wafer surface inspection apparatus. In FIG. 11A, regular hexagon-like facet growth areas are orderly aligned. On the other hand, in FIG. 11B, the arrangement of the facet growth areas is disordered as compared with the arrangement in FIG. 11A.

In FIG. 11A, the regular arrangement pattern of the facet growth areas is the same square lattice arrangement as that of the dot masks in the selective growth mask, and the interval between the closest lattice positions is 800 μm.

In FIG. 11B, when carefully observed, the facet growth areas are partially on the lattice positions of a square lattice having the same period as in FIG. 11A. The arrangement of the facet growth areas is low in regularity, but is not random.

Among the C-plane GaN substrates of Experiment 1, the substrate made of the GaN crystal grown at the position near the seed had the facet growth areas regularly arranged on many parts of the gallium polar surface, as in an example illustrated in FIG. 11A. On the other hand, the substrate made of the GaN crystal grown at the position far from the seed had both an area with a high arrangement regularity of the facet growth areas and an area with a low arrangement regularity of the facet growth areas on the gallium polar surface. As the growth position of the GaN crystal forming the substrate was farther from the seed, the proportion occupied by the area where the arrangement of the facet growth areas was disordered on the gallium polar surface tended to be higher.

It was confirmed from observation of the entire gallium polar surface that the C-plane GaN substrate of Experiment 1 had no facet growth area accompanied by a core at all.

A fluorescence microscope observation showed that the sum of the areas of all the facet growth areas present on the gallium polar surface of the C-plane GaN substrate of Experiment 1 was more than 80% of the area of the gallium polar surface.

When the off-angle of the C-plane GaN substrate of Experiment 1 was examined by XRD (X-ray diffraction) analysis, it was found that the variation widths of the a-axis direction component and the m-axis direction component of the off-angle within an area distant by 5 mm or more from the outer periphery of the substrate (area having a diameter of 4 cm) were 0.100 degrees and 0.048 degrees, respectively.

The oxygen concentration examined by Dynamic-SIMS in the facet growth area on the main surface of the C-plane GaN substrate of Experiment 1 was $1.3 \times 10^{18}$ cm$^{-3}$.

The electrical resistivity of the C-plane GaN substrate of Experiment 1 measured by a van der Pauw method was between $1 \times 10^{-2}$ Ω·cm and $2 \times 10^{-2}$ Ω·cm.

4.2. Experiment 2

The same GaN template as that used in Experiment 1 was prepared, and a selective growth mask was formed on the GaN film of the GaN template in the same manner as in Experiment 1. The first pattern and the second pattern of the selective growth mask, however, were changed as follows.

The first pattern was a pattern consisting of regular hexagon dots each having a maximum width of 35 μm and arranged into a square lattice. The distance between the closest lattice positions, namely, the length of one side of a square being a unit lattice was 200 μm. Accordingly, the number density of the dot masks was 2496 cm$^{-2}$ and the ratio of the area occupied by the dot masks in the selective growth mask was 1.9%.

The second pattern was a hexagon lattice net pattern with a line width of 1 μm, and the period thereof was determined so that the opening ratio was 25%.

Subsequently, a GaN crystal was grown on the GaN template with the selective growth mask provided on the GaN film, by an HVPE method. The quartz reactor was used as in Experiment 1, and the growth conditions were also the same as in Experiment 1.

After the completion of GaN crystal growth, the reactor temperature was lowered to room temperature to take out the GaN crystal grown. The GaN crystal grown was able to be separated from the GaN template by applying almost no external force.

The GaN crystal was processed in the same manner as in Experiment 1, to provide a C-plane GaN substrate having a diameter of 5 cm (2 inches). Also in the C-plane GaN substrate of Experiment 2, while a large number of cones were densely formed on the nitrogen polar surface by etching, no cones were observed on the gallium polar surface at all, as in the C-plane GaN substrate of Experiment 1. It was confirmed from this that the C-plane GaN substrate of Experiment 2 was free from any inversion domain.

Figure 12:
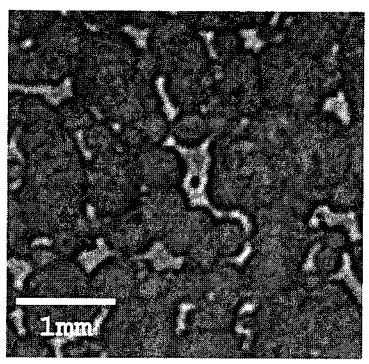
FIG. 12 is an optical image of a gallium polar surface of a C-plane GaN substrate.

FIG. 12 illustrates an optical image of the gallium polar surface of the C-plane GaN substrate of Experiment 2, obtained by use of a semiconductor wafer surface inspection apparatus. While a plurality of facet growth areas each having a closed ring outline-shape were formed on the gallium polar surface, no regularity was found in the arrangement. It is considered that this is because the dot mask pitch in the first pattern was as small as 200 μm.

In the image of FIG. 12, the boundary between facet growth areas is unclear in an area where the facet growth areas are aggregated. It is considered that this is because clear step were not formed between the facet growth areas in contact with each other.

It was confirmed from observation of the entire gallium polar surface that the C-plane GaN substrate of Experiment 2 had no facet growth area accompanied by a core at all.

A fluorescence microscope observation showed that the sum of the areas of all the facet growth areas present on the gallium polar surface of the C-plane GaN substrate of Experiment 2 was more than 80% of the area of the gallium polar surface.

When the off-angle of the C-plane GaN substrate of Experiment 2 was examined by XRD (X-ray diffraction) analysis, it was found that the variation widths of the a-axis direction component and the m-axis direction component of the off-angle within an area distant by 5 mm or more from the outer periphery of the substrate (area having a diameter of 4 cm) were 0.016 degrees and 0.022 degrees, respectively.

The oxygen concentration examined by Dynamic-SIMS in the facet growth area on the main surface of the C-plane GaN substrate of Experiment 2 was $1.4 \times 10^{18}$ cm$^{-3}$.

The electriccal resistivity of the C-plane GaN substrate of Experiment 2 measured by a van der Pauw method was between $1 \times 10^{-2}$ Ω·cm and $2 \times 10^{-2}$ Ω·cm.

4.3. Experiment 3

In Experiment 3, a GaN template was prepared which comprised a C-plane sapphire substrate having a diameter of 127 mm and a c-axis-oriented GaN film epitaxially grown on the substrate by an MOCVD method. A selective growth mask was formed on the GaN film of the GaN template in the same manner as in Experiment 1. The pattern of the selective growth mask was the same as in Experiment 1.

After formation of the selective growth mask, a GaN crystal was grown on the GaN template by an HVPE method. The HVPE apparatus equipped with a hot-wall type quartz reactor was used as in Experiment 1. The outer periphery of the GaN template was covered with a ring, so that only an area of 110 mm diameter on the main surface of the GaN template was exposed.

Until 75 minutes after the beggining of epitaxial growth, conditions with a growth temperature of 983° C., a reactor pressure of 101 kPa, an ammonia partial pressure of 10.3 kPa, a GaCl partial pressure of 0.7 kPa, a hydrogen gas partial pressure of 75.6 kPa and a nitrogen gas partial pressure of 14.4 kPa were used.

Next, while raw material gases and carrier gases were continuously supplied, the growth temperature was raised from 983° C. to 1005° C.

Next, the GaN crystal was grown for 1 hour under conditions with a growth temperature of 1005° C., a reactor pressure of 101 kPa, an ammonia partial pressure of 10.3 kPa, a GaCl partial pressure of 1.0 kPa, a hydrogen gas partial pressure of 75.3 kPa and a nitrogen gas partial pressure of 14.4 kPa. Dichlorosilane was also supplied as a silicon doping gas into the reactor at and after this stage.

Next, while the flow rates of the raw material gases and the carrier gases were maintained, the growth temperature was dropped from 1005° C. to 983° C.

Next, while the flow rates of the raw material gases and the carrier gases were maintained, the GaN crystal was grown for 2 hours.

Next, while the flow rates of the raw material gases and the carrier gases were maintained, the growth temperature was raised from 983° C. to 1005° C.

Next, while the flow rates of the raw material gases and the carrier gases were maintained, the GaN crystal was grown for 70 hours.

After the completion of GaN crystal growth, the reactor temperature was lowered to room temperature to take out the GaN crystal grown. The GaN crystal grown was able to be separated from the GaN template by applying almost no external force.

The GaN crystal was processed in the same manner as in Experiment 1, to provide a C-plane GaN substrate having a diameter of 10 cm (4 inches). Also in the C-plane GaN substrate of Experiment 3, while a large number of cones were densely formed on the nitrogen polar surface by etching, no cones were observed on the gallium polar surface at all, as in the C-plane GaN substrate of Experiment 1. It was confirmed from this that the C-plane GaN substrate of Experiment 3 was also free from any inversion domain.

Figure 13A:
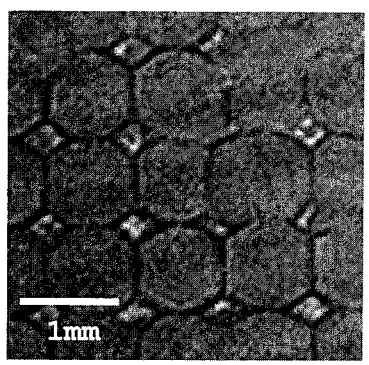
FIGS. 13A and 13B are each an optical image of a gallium polar surface of a C-plane GaN substrate.
Figure 13B:
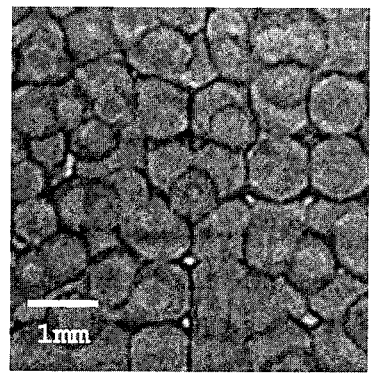

FIGS. 13A and 13B each illustrate an optical image example of the gallium polar surface of the C-plane GaN substrate of Experiment 3, obtained by use of a semiconductor wafer surface inspection apparatus. In FIG. 13A, regular hexagon-like or circle-like facet growth areas are orderly aligned. On the other hand, in FIG. 13B, the arrangement of the facet growth areas is disordered as compared with the arrangement in FIG. 13A.

In FIG. 13A, the regular arrangement pattern of the facet growth areas is the same square lattice arrangement as that of the dot masks in the selective growth mask, and the interval between the closest lattice positions is 800 μm.

In FIG. 13B, when carefully observed, the facet growth areas are partially on the lattice positions of a square lattice having the same period as in FIG. 13A. The arrangement of the facet growth areas is low in regularity, but is not random.

Among the C-plane GaN substrates of Experiment 3, the substrate made of the GaN crystal grown at the position near the seed had the facet growth areas regularly arranged on many parts of the gallium polar surface, as in an example illustrated in FIG. 13A. On the other hand, the substrate made of the GaN crystal grown at the position far from the seed had both an area with a high arrangement regularity of the facet growth areas and an area with a low arrangement regularity of the facet growth areas on the gallium polar surface. As the growth position of the GaN crystal forming the substrate was farther from the seed, the proportion occupied by the area where the arrangement of the facet growth areas was disordered on the gallium polar surface tended to be higher.

It was confirmed from observation of the entire gallium polar surface that the C-plane GaN substrate of Experiment 3 had no facet growth area accompanied by a core at all.

A fluorescence microscope observation showed that the sum of the areas of all the facet growth areas present on the gallium polar surface of the C-plane GaN substrate of Experiment 3 was more than 80% of the area of the gallium polar surface.

When the off-angle of the C-plane GaN substrate of Experiment 3 was examined by XRD (X-ray diffraction) analysis, it was found that the variation widths of the a-axis direction component and the m-axis direction component of the off-angle within an area distant by 5 mm or more from the outer periphery of the substrate (area having a diameter of 9 cm) were 0.07 degrees and 0.07 degrees, respectively.

The oxygen concentration examined by Dynamic-SIMS in the facet growth area on the main surface of the C-plane GaN substrate of Experiment 3 was $1.3 \times 10^{18}$ cm$^{-3}$.

The electrical resistivity of the C-plane GaN substrate of Experiment 3 measured by a van der Pauw method was between $1 \times 10^{-2}$ Ω·cm and $2 \times 10^{-2}$ Ω·cm.

4.4. Experiment 4

The same GaN template as that used in Experiment 1 was prepared, and a selective growth mask was formed on the GaN film of the GaN template in the same manner as in Experiment 1.

The first pattern of the selective growth mask, however, was changed in Experiment 4. Specifically, the first pattern was a pattern consisting of regular hexagon dots each having a maximum width of 115 μm and arranged in a square lattice manner. The distance between the closest lattice positions, namely, the length of one side of a square being a unit lattice was 800 μm. Accordingly, the number density of the dot masks was 156 cm$^{-2}$, and the ratio of the area occupied by the dot masks in the selective growth mask was 1.35%.

The second pattern was the same as the selective growth mask used in Experiment 1.

After formation of the selective growth mask, a GaN crystal was grown on the GaN template by an HVPE method. The HVPE apparatus equipped with a hot-wall type quartz reactor was used as in Experiment 1. The outer periphery of the GaN template was covered with a ring, so that only an area of 70 mm diameter on the main surface of the GaN template was exposed.

Until 40 minutes after the beggining of epitaxial growth, conditions with a growth temperature of 1010° C., a reactor pressure of 101 kPa, an ammonia partial pressure of 10.4 kPa, a GaCl partial pressure of 0.79 kPa, a hydrogen gas partial pressure of 64.3 kPa and a nitrogen gas partial pressure of 25.4 kPa were used.

Next, with the same growth temperature and reactor pressure being kept, the GaN crystal was grown for 72 hours under conditions with an ammonia partial pressure of 10.4 kPa, a GaCl partial pressure of 1.1 kPa, a hydrogen gas partial pressure of 64.1 kPa and a nitrogen gas partial pressure of 25.5 kPa.

After the completion of GaN crystal growth, the reactor temperature was lowered to room temperature to take out the GaN crystal grown.

The GaN crystal was processed in the same manner as in Experiment 1, to provide a C-plane GaN substrate having a diameter of 5 cm (2 inches). Also in the C-plane GaN substrate of Experiment 4, while a large number of cones were densely formed on the nitrogen polar surface by etching, no cones were observed on the gallium polar surface at all, as in the C-plane GaN substrate of Experiment 1.

Figure 14:
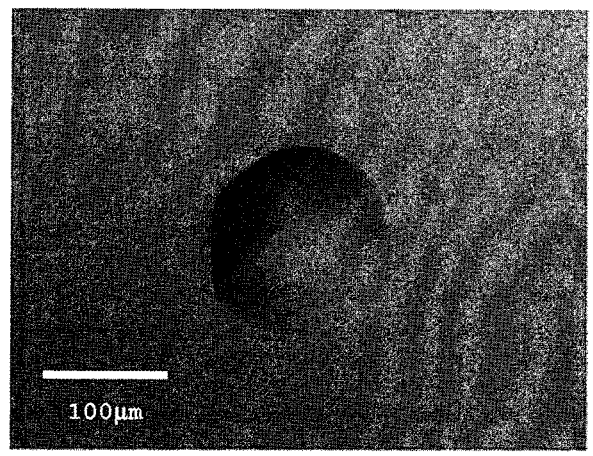
FIG. 14 is an SEM image of a depression generated on a gallium polar surface of a C-plane GaN substrate due to a core.

On the gallium polar surface of the thus produced C-plane GaN substrate of Experiment 4, 120 dot-shaped depressions each having a depth of 0.5 to 1 μm and a width of 50 to 1000 μm occurred (number density: 6.1 cm$^{-2}$). FIG. 14 is a SEM image illustrating the appearance of one of such depressions.

The depressions were each generated at the center of the facet growth area and the same image as in FIG. 10 was obtained by CL observation, and it was thus found that such depressions were generated owing to the cores.

4.5. Experiment 5

In Experiment 5, a GaN template was prepared which comprised a C-plane sapphire substrate having a diameter of 127 mm and a c-axis-oriented GaN film epitaxially grown on the substrate by an MOCVD method. A selective growth mask was formed on the GaN film of the GaN template in the same manner as in Experiment 1. The pattern of the selective growth mask was the same as in Experiment 1.

After formation of the selective growth mask, a GaN crystal was grown on the GaN template by an HVPE method. The HVPE apparatus equipped with a hot-wall type quartz reactor was used as in Experiment 1. The outer periphery of the GaN template was covered with a ring, so that only an area of 110 mm diameter on the main surface of the GaN template was exposed.

Until 75 minutes after the beggining of epitaxial growth, conditions with a growth temperature of 965° C., a reactor pressure of 101 kPa, an NH$_3$ partial pressure of 10.3 kPa, a GaCl partial pressure of 0.7 kPa, an H$_2$ partial pressure of 75.6 kPa and an N$_2$ partial pressure of 14.4 kPa were used.

Next, while raw material gases and carrier gases were continuously supplied, the growth temperature was raised from 965° C. to 1005° C.

Next, the GaN crystal was grown for 1 hour under conditions with a growth temperature of 1005° C., a reactor pressure of 101 kPa, an NH$_3$ partial pressure of 10.3 kPa, a GaCl partial pressure of 1.0 kPa, an H$_2$ partial pressure of 75.3 kPa and an N$_2$ partial pressure of 14.4 kPa. In addition, dichlorosilane started to be supplied as a silicon doping gas into the reactor at this stage.

Next, while the flow rates of the raw material gases and the carrier gases were maintained, the growth temperature was dropped from 1005° C. to 983° C.

Next, while the flow rates of the raw material gases and the carrier gases were maintained, the GaN crystal was grown for 2 hours.

Next, while the flow rates of the raw material gases and the carrier gases were maintained, the growth temperature was raised from 983° C. to 1005° C.

Next, while the flow rates of the raw material gases and the carrier gases were maintained, the GaN crystal was grown for 70 hours.

After the completion of GaN crystal growth, the reactor temperature was lowered to room temperature to take out the GaN crystal grown. The grown GaN crystal was able to be separated from the GaN template by applying almost no external force.

The GaN crystal was processed in the same manner as in Experiment 1, to provide a C-plane GaN substrate having a diameter of 10 cm (4 inches).

The C-plane GaN substrate of Experiment 5 was different from the C-plane GaN substrate of Experiment 1 in that not only a large number of cones were formed on the nitrogen polar surface by etching, but also cones were formed on the gallium polar surface. It was found from this that the GaN crystal forming the C-plane GaN substrate of Experiment 5 comprised inversion domains.

Figure 15:
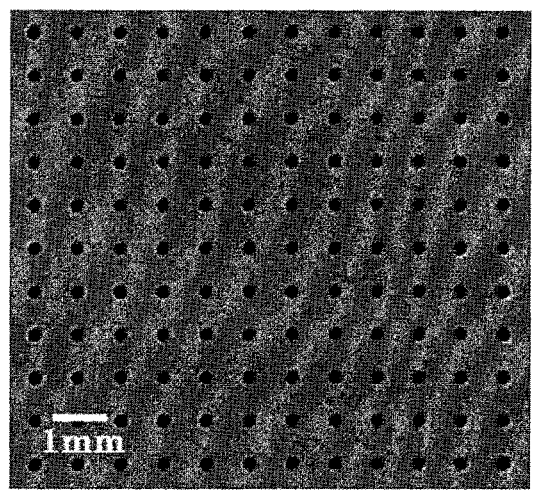
FIG. 15 is an optical image of a gallium polar surface of a C-plane GaN substrate having inversion domains.

FIG. 15 illustrates an optical image of the gallium polar surface of the C-plane GaN substrate of Experiment 5, obtained by use of a semiconductor wafer surface inspection apparatus.

The arrangement of a plurality of dots found in the image of FIG. 15 was the same square lattice arrangement as that of the dot masks in the selective growth mask, and the interval between the closest lattice positions was 800 μm. Additionally, the area appears as a dot in the image of FIG. 15 was identical to the area where the cone was observed on the gallium polar surface, and it is thus considered that, when the GaN crystal was grown, the inversion domain was formed at a position corresponding to the dot mask.

4.6. Others

In the GaN crystal grown in each of Experiments 1 to 4, a group of dislocations were observed which arose from the vicinity of the surface of the dot mask as the starting point. The scale of the group of dislocations tended to be larger along with the maximum diameter of the dot mask. The group of dislocations tended to scatter as the GaN crystal grew in the c-axis direction, but it did not completely scatter, and as a result, a portion having a locally raised dislocation density was observed on the main surface of the produced C-plane GaN substrate. The dislocation density in such a portion reached the order of 10$^7$ cm$^{-2}$.

Although the present invention is described with reference to specific embodiments as above, the respective embodiments are presented only for illustration and are not intended to limit the scope of the present invention. The embodiments described in the present specification can be variously modified without departing from the gist of the present invention, and each thereof can be combined with any feature described in another embodiment as long as such a combination can be carried out.

REFERENCE SIGNS LIST

10 C-plane GaN substrate
11 gallium polar surface
12 nitrogen polar surface
13 side surface

The invention claimed is:

1. A C-plane GaN substrate comprising:
a main surface; and
a plurality of facet growth areas each having a closed ring outline-shape on the main surface, wherein
a number density of the facet growth area accompanied by a core among the plurality of facet growth areas is less than 5 cm$^{-2}$ on the main surface,
the number density is the number of the facet growth areas accompanied by cores that are observed on the main surface in a unit area,
in any circular area of 4 cm diameter formed on the main surface inside a circle disposed at 5 mm from the outer peripheral edge of the substrate, a variation range of an off-angle with respect to an a-axis direction component and with respect to an m-axis direction component within the circular area is 0.25 degrees or less for each component, said off-angle being a tilt angle of a normal vector to the main surface with respect to a c-axis as a reference, and the substrate includes either or both of silicon and germanium.

2. The C-plane GaN substrate according to claim 1, wherein the substrate has a C-plane growth area lying outside the plurality of facet growth areas on the main surface.

3. The C-plane GaN substrate according to claim 1, wherein the number density of the facet growth area accompanied by an inversion domain among the plurality of facet growth areas is 0 cm$^{-2}$ on the main surface.

4. The C-plane GaN substrate according to claim 1, wherein the sum of the areas of all the facet growth areas present on the main surface is 70% or more of the area of the main surface.

5. The C-plane GaN substrate according to claim 1, wherein the plurality of facet growth areas are at least partially regularly arranged.

6. The C-plane GaN substrate according to claim 5, wherein the arrangement of the facet growth areas regularly arranged among the plurality of facet growth areas is a square lattice arrangement or a triangle lattice arrangement.

7. The C-plane GaN substrate according to claim 1, wherein the substrate has an electrical resistivity of 0.1 Ω·cm or less.

8. A method for producing a nitride semiconductor device, comprising a step of preparing the C-plane GaN substrate according to claim 1, and a step of epitaxially growing at least one nitride semiconductor layer on the prepared C-plane GaN substrate.

9. A method for producing an epitaxial wafer, comprising a step of preparing the C-plane GaN substrate according to claim 1, and a step of epitaxially growing at least one nitride semiconductor layer on the prepared C-plane GaN substrate.

10. The C-plane GaN substrate according to claim 1, wherein the number density of the facet growth area corresponds to the number of dot-shaped depressions observed on the main surface in the unit area.

11. A C-plane GaN substrate having a diameter of 95 to 105 mm comprising:
a main surface; and
a plurality of facet growth areas each having a closed ring outline-shape on the main surface, wherein
a number density of the facet growth area accompanied by a core among the plurality of facet growth areas is less than 5 cm$^{-2}$ on the main surface,
the number density is the number of the facet growth areas accompanied by cores that are observed on the main surface in a unit area, and
in an area on the main surface inside a circle disposed at 5 mm from the outer peripheral edge of the substrate, a variation range of an off-angle with respect to an a-axis direction component and with respect to an m-axis direction component is 0.5 degrees or less for each component, said off-angle being a tilt angle of a normal vector to the main surface with respect to a c-axis as a reference.

12. The C-plane GaN substrate according to claim 11, wherein the substrate has a C-plane growth area lying outside the plurality of facet growth areas on the main surface.

13. The C-plane GaN substrate according to claim 11, wherein the number density of the facet growth area accompanied by an inversion domain among the plurality of facet growth areas is 0 cm$^{-2}$ on the main surface.

14. The C-plane GaN substrate according to claim 11, wherein the sum of the areas of all the facet growth areas present on the main surface is 70% or more of the area of the main surface.

15. The C-plane GaN substrate according to claim 11, wherein the plurality of facet growth areas are at least partially regularly arranged.

16. The C-plane GaN substrate according to claim 15, wherein the arrangement of the facet growth areas regularly arranged among the plurality of facet growth areas is a square lattice arrangement or a triangle lattice arrangement.

17. The C-plane GaN substrate according to claim 11, wherein the substrate is added with either or both of silicon and germanium.

18. The C-plane GaN substrate according to claim 11, wherein the substrate has an electrical resistivity of 0.1 Ω·cm or less.

19. A method for producing a nitride semiconductor device, comprising a step of preparing the C-plane GaN substrate according to claim 11, and a step of epitaxially growing at least one nitride semiconductor layer on the prepared C-plane GaN substrate.

20. A method for producing an epitaxial wafer, comprising a step of preparing the C-plane GaN substrate according to claim 11, and a step of epitaxially growing at least one nitride semiconductor layer on the prepared C-plane GaN substrate.

21. A C-plane GaN substrate comprising:
a main surface; and
a plurality of facet growth areas each having a closed ring outline-shape on the main surface, wherein
a number density of the facet growth area accompanied by a core among the plurality of facet growth areas is less than 5 cm$^{-2}$ on the main surface,
the number density is the number of the facet growth areas accompanied by cores that are observed on the main surface in a unit area,
in any circular area of 4 cm diameter formed on the main surface inside a circle disposed at 5 mm from the outer peripheral edge of the substrate, a variation range of an off-angle with respect to an a-axis direction component and with respect to an m-axis direction component within the circular area is 0.25 degrees or less for each component, said off-angle being a tilt angle of a normal vector to the main surface with respect to a c-axis as a reference, and
the number density of the facet growth area accompanied by an inversion domain among the plurality of facet growth areas is 0 cm$^{-2}$ on the main surface.

22. A C-plane GaN substrate comprising:
a main surface; and
a plurality of facet growth areas each having a closed ring outline-shape on the main surface, wherein
a number density of the facet growth area accompanied by a core among the plurality of facet growth areas is less than 5 cm$^{-2}$ on the main surface,
the number density is the number of the facet growth areas accompanied by cores that are observed on the main surface in a unit area,
in any circular area of 4 cm diameter formed on the main surface inside a circle disposed at 5 mm from the outer peripheral edge of the substrate, a variation range of an off-angle with respect to an a-axis direction component and with respect to an m-axis direction component within the circular area is 0.25 degrees or less for each component, said off-angle being a tilt angle of a normal vector to the main surface with respect to a c-axis as a reference, and the sum of the areas of all the facet growth areas present on the main surface is 70% or more of the area of the main surface.

\* \* \* \* \*